United States Patent [19]

Yamamoto et al.

[11] Patent Number: 5,932,118
[45] Date of Patent: Aug. 3, 1999

[54] PHOTOPROCESSING METHOD

[75] Inventors: Yasuaki Yamamoto, Higashiosaka; Seiichi Kiyama, Takatsuki; Wataru Shinohara, Hirakata, all of Japan

[73] Assignee: Sanyo Electric Co., Ltd., Osaka-fu, Japan

[21] Appl. No.: 08/845,394

[22] Filed: Apr. 25, 1997

Related U.S. Application Data

[63] Continuation of application No. 08/436,575, May 8, 1995, abandoned.

[30] Foreign Application Priority Data

May 16, 1994 [JP] Japan .................................. 6-127038

[51] Int. Cl.$^6$ .................................................. H01L 21/00
[52] U.S. Cl. ................................. 219/121.66; 219/121.77; 219/121.69; 430/945; 430/321; 438/940; 438/795; 136/261; 136/244
[58] Field of Search .......................... 219/121.6, 121.66, 219/121.69, 121.61, 121.7, 121.77, 121.71; 430/845, 321; 438/795, 940; 136/261, 244

[56] References Cited

U.S. PATENT DOCUMENTS

| Re. 33,947 | 6/1992 | Shinohara | 219/121.69 |
|---|---|---|---|
| 3,549,733 | 12/1970 | Caddell | 219/121.69 |
| 3,584,948 | 6/1971 | Herriott | 355/77 |
| 3,588,439 | 6/1971 | Heller et al. | 219/121.77 |
| 3,947,093 | 3/1976 | Goshima et al. | 219/121.6 |
| 4,128,752 | 12/1978 | Gravel | 219/121.77 |
| 4,301,353 | 11/1981 | Suenaga et al. | 219/121.69 |
| 4,339,177 | 7/1982 | March | 359/707 |
| 4,463,028 | 7/1984 | Laude | 136/261 |
| 4,478,677 | 10/1984 | Chen et al. | 219/121.71 |
| 4,680,855 | 7/1987 | Yamazaki et al. | 29/583 |
| 4,713,518 | 12/1987 | Yamazaki et al. | 219/121 |
| 4,755,475 | 7/1988 | Kiyama et al. | 219/121.69 |
| 4,842,782 | 6/1989 | Portney et al. | 219/121.69 |
| 4,870,031 | 9/1989 | Sugahara et al. | 437/82 |
| 4,874,920 | 10/1989 | Yamazaki et al. | 219/121.85 |
| 4,879,451 | 11/1989 | Gart | 219/121.69 |
| 4,970,369 | 11/1990 | Yamazaki et al. | 219/121.85 |
| 5,237,148 | 8/1993 | Aoki et al. | 219/121.7 |
| 5,272,361 | 12/1993 | Yamazaki et al. | 257/66 |
| 5,618,446 | 4/1997 | Nagaishi | 216/65 |

OTHER PUBLICATIONS

Jenkins & White, "Fundamentals of Optics", pp. 62–63 & 72–73, 1976.
Jenkins et al., "Fundamentals of Optics" (© 1976) pp. 62–73.

Primary Examiner—Martin Angebranndt
Attorney, Agent, or Firm—Armstrong, Westerman, Hattori, McLeland & Naughton

[57] ABSTRACT

In processing an object to be processed by a laser beam, the laser beam is expanded by a beam expander and is introduced into a mask in which a light transmitted portion having a desired pattern is formed, the laser beam introduced into the mask is passed through the light transmitted portion having a desired pattern, to obtain a laser beam corresponding to the pattern of the light transmitted portion as well as having an approximately uniform energy distribution, the laser beam is formed and projected on the object to be processed by an image forming lens, and processing corresponding to the pattern of the light transmitted portion is performed on the object to be processed by the laser beam formed and projected. By this photoprocessing, a part of photoelectric converting elements in a photovoltaic device are removed to perform groove processing, or an amorphous semiconductor film is crystallized.

6 Claims, 14 Drawing Sheets

PHOTOPROCESSING METHOD

This application is a continuation of application Ser. No. 08/436,575 filed May 8, 1995, now abandoned.

BACKGROUND OF THE INVENTION

1. Field of the Invention

The present invention relates generally to a photoprocessing method for processing an object to be processed using a laser beam, and more particularly, to a photoprocessing method used for processing photoelectric converting elements in a photovoltaic device to fabricate the photovoltaic device or crystallizing an amorphous semiconductor film.

2. Description of the Prior Art

A photoprocessing method using a laser beam has been conventionally employed in order to finely process photoelectric converting elements in a photovoltaic device to fabricate the photovoltaic device or crystallize an amorphous semiconductor film.

As such a photoprocessing method using a laser beam, a YAG laser processing method using YAG laser having a fundamental wavelength of 1.06 $\mu$m has been conventionally utilized widely.

In the conventional YAG laser processing method, a laser beam in a spot shape is irradiated onto an object to be processed. For example, when a photovoltaic device constructed by electrically connecting a plurality of photovoltaic converting elements 20 in series is fabricated on the surface of an insulating substrate 11, as shown in FIG. 1, a laser beam in a spot shape irradiated from a laser device 1 is generally reflected from a reflector 2, the laser beam thus reflected is gathered by a lens 3 and is irradiated onto an object to be processed, the laser beam is scanned in the direction of processing to perform groove processing on the object to be processed, and such scanning is repeated, thereby to form a plurality of grooves in the object to be processed.

The steps of fabricating the above described photovoltaic device will be specifically described.

A continuous first electrode film 12 is first formed on the surface of the insulating substrate 11, as shown in FIG. 1(A). The laser beam in a spot shape irradiated from the laser device 1 as described above is reflected from the reflector 2, the reflected laser beam is gathered by the lens 3 and is irradiated onto the first electrode film 12, and the laser beam is scanned, to perform groove processing for forming a plurality of grooves on the first electrode film 12, so that the first electrode film 12 is divided for each photoelectric converting element 20, as shown in FIG. 1 (B). A continuous photoelectric converting layer 13 is then formed on the substrate 11 in which the first electrode film 12 is divided, as shown in FIG. 1(C). Thereafter, groove processing for forming a plurality of grooves is similarly performed on the photoelectric converting layer 13, so that the photoelectric converting layer 13 is divided for each photoelectric converting element 20, as shown in FIG. 1(D). A continuous second electrode film 14 is further formed on the divided photoelectric converting layer 13, as shown in FIG. 1(E). Thereafter, groove processing for forming a plurality of grooves is similarly performed on the second electrode film 14, so that the second electrode film 14 is divided for each photoelectric converting element 20, as shown in FIG. 1(F). The above described photovoltaic device is thus fabricated.

When the laser beam in a spot shape is successively scanned in the direction of processing as described above, to perform groove processing with spots of the laser beam successively continued, however, the scanning speed or the like must be suitably controlled depending on a material to be processed, whereby the control is difficult, and the laser beam must be scanned for each groove processing for forming one groove. If the photovoltaic device requiring groove processing for forming a lot of grooves is fabricated as described above, therefore, it takes a lot of time to fabricate the photovoltaic device, resulting in very poor productivity.

Furthermore, when the groove processing is performed with the spots of the laser beam in a spot shape successively continued as described above, a portion where the spots of the laser beam are overlapped with each other occurs, as shown in FIG. 2. The laser beam is irradiated twice in the portion where the spots are thus overlapped with each other. Therefore, the object to be processed is thermally affected in the portion where the spots are thus overlapped with each other of the laser beam, whereby some problems arise. For example, the object to be processed is degraded in the portion.

Additionally, in the case of YAG laser conventionally used, its optical energy is as low as 1.23 eV, whereby processing using the laser beam becomes difficult depending on the material of the object to be processed. In fabricating the above described photovoltaic device, groove processing cannot, in some cases, be performed on the first and second electrode films 12 and 14 and the photoelectric converting layer 13.

In recent years, therefore, a photoprocessing method of expanding a pulse laser beam by a beam expander to increase the area thereof, gathering the laser beam the area of which is thus increased by a cylindrical lens or the like to make the laser beam linear, and irradiating the linear laser beam onto an object to be processed to perform groove processing on the object to be processed, as disclosed in Japanese Patent Laid-Open No. 206558/1993, has been developed in order to solve the above described problems.

When the laser beam thus expanded by the beam expander is gathered by the cylindrical lens or the like, however, the Gaussian distribution occurs in the energy intensity of the laser beam by the light gathering. Consequently, energy in the center of the laser beam becomes higher than energy in the periphery thereof. When the laser beam thus gathered is irradiated onto the object to be processed to perform processing, abnormalities occur in the center and the periphery of a processed portion on which the laser beam is irradiated.

For example, in fabricating a photovoltaic device constructed by electrically connecting a plurality of photoelectric converting elements 20 in series on the insulating surface of the substrate 11 as described above, when the first electrode film 12 continuously formed on the substrate 11 such as a glass substrate or an organic film substrate is subjected to groove processing, and the first electrode film 12 is divided for each photoelectric converting element 20, the laser beam gathered to be made linear as described above is irradiated onto the first electrode film 12. When the first electrode film 12 is removed from above the substrate 11 in a portion on which the laser beam is irradiated to perform groove processing, the substrate 11 under the first electrode film 12 is thermally damaged to be degraded in a portion 11a on which the laser beam in the center having high energy is irradiated, whereby a microcrack occurs in this portion 11a.

Consider a case where the photoelectric converting layer 13 such as an amorphous semiconductor film is continuously formed on the substrate 11 in which the first electrode film 12 is divided as described above, after which groove processing is performed on the photoelectric converting layer 13, to divide the photoelectric converting layer 13 for each photoelectric converting element 20 and expose the first electrode film 12 connecting the adjacent photoelectric converting elements 20 in series. In this case, if the laser beam gathered to be made linear is irradiated onto the photoelectric converting layer 13 to perform groove processing as described above, the energy in the center of the laser beam and the energy in the periphery thereof differ from each other, whereby various problems as shown in FIGS. 4(a) to 4(C) arise.

Specifically, in the above described laser beam, the energy in the center thereof is higher than the energy in the periphery thereof. Even if the photoelectric converting layer 13 in the portion on which the laser beam in the center is irradiated is successfully removed, therefore, the photoelectric converting layer 13 is not successfully removed in the portion on which the laser beam in the periphery having low energy is irradiated, and the photoelectric converting layer 13 in this portion is annealed, to be finely crystallized or crystallized, whereby low resisting portions 15a and 15b are formed, as shown in FIG. 4(A). Even if the photoelectric converting elements 20 are separated from each other after a second electrode film 14 is formed on the photoelectric converting layer 13, therefore, the first electrode film 12 and the second electrode film 14 are coupled to each other and are short-circuited by the above described low resisting portion 15b within one of the photoelectric converting elements 20.

Furthermore, the photoelectric converting layer 13 is not sufficiently removed in the above described portion on which the laser beam is irradiated, so that a molten object 16 of the photoelectric converting layer 13 may, in some cases, remain in the portion on which the laser beam is irradiated, as shown in FIG. 4(B). Accordingly, it is impossible to accurately process the photoelectric converting layer 13 to have a predetermined pattern.

On the other hand, when the photoelectric converting layer 13 is removed also in the portion on which the laser beam in the periphery having low energy is irradiated, the first electrode film 12 under the photoelectric converting layer 13 is thermally damaged to be degraded in a portion 12a on which the laser beam in the center having high energy is irradiated, as shown in FIG. 4(C), whereby some problems arise. For example, the resistance of the first electrode film 12 is increased in this portion 12a.

Furthermore, even when the photoelectric converting layer 13 is divided between the adjacent photoelectric converting elements 20 as described above, after which the second electrode film 14 is continuously formed on the photoelectric converting layer 13 thus divided, the above described laser beam is irradiated onto the second electrode film 14 to perform groove processing, and the second electrode film 14 is divided between the adjacent photoelectric converting elements 20, the energy in the center of the laser beam and the energy in the periphery thereof differ from each other, whereby various problems as shown in FIGS. 5(A) to 5(D) arise.

For example, when the second electrode film 14 formed on the photoelectric converting layer 13 is subjected to groove processing by the above described laser beam, to divide the second electrode film 14 between the adjacent photoelectric converting elements 20, the energy in the center of the laser beam is higher than the energy in the periphery thereof. As shown in FIG. 5(A), therefore, the photoelectric converting layer 13 under the second electrode film 14 is annealed in the portion on which the laser beam in the center is irradiated, so that the photoelectric converting layer 13 in this portion is finely crystallized or crystallized to form a low resisting portion 15. As shown in FIG. 5(B), the second electrode film 14 is not removed and is melted in the portion on which the laser beam in the periphery having low energy is irradiated. The molten object 16 flows out. Portions into which the second electrode film 14 is divided are connected to each other by the molten object 16. Therefore, the second electrode film 14 cannot be reliably divided between the adjacent photoelectric converting elements 20.

Furthermore, in dividing the second electrode film 14 between the adjacent photoelectric converting elements 20, when the second electrode films 14 and the photoelectric converting layer 13 under the second electrode film 14 are subjected to groove processing by the above described laser beam, the second electrode film 14 and the photoelectric converting layer 13 are respectively divided because their respective parts are removed in the portion on which the laser beam in the center having high energy is irradiated, as shown in FIG. 5(C). However, the photoelectric converting layer 13 is annealed in the portion on which the laser beam in the periphery having low energy is irradiated, and the photoelectric converting layer 13 in this portion is finely crystallized or crystallized, to form low resisting portions 15a and 15b. As shown in FIG. 5(D), molten objects 16a and 16b of the second electrode film 14 melted by the laser beam flow out, to be connected to the first electrode film 12. Therefore, the first electrode film 12 and the second electrode film 14 are coupled to each other and are short-circuited within the same photoelectric converting element 20 by the low resisting portion 15b and the molten object 16b.

Additionally, as a technique for correcting defects occurring in forming a photomask on the object to be processed, which is not a method of directly processing the object to be processed by a laser beam, there exists a technique for restraining the magnitude of the laser beam through a rectangular slit formed in the mask, gathering the laser beam passed through the slit by a condensing lens and irradiating the laser beam onto a defective portion, thereby to correct the defective portion.

Also in this case, however, the laser beam gathered by the condensing lens is irradiated. When the laser beam thus gathered is directly irradiated onto the object to be processed to perform processing, therefore, abnormalities occur in the center and the periphery of a processed portion on which the laser beam is irradiated, as in the above described case.

Furthermore, the laser beam has been conventionally irradiated onto an amorphous semiconductor film, to crystallize the amorphous semiconductor film.

Also in this case, however, if the energy in the center of the laser beam and the energy in the periphery thereof differ from each other as described above, crystals are nonuniform when the amorphous semiconductor film is crystallized. Therefore, a good crystallized semiconductor layer having uniform properties is not obtained.

SUMMARY OF THE INVENTION

An object of the present invention is to make it possible to simply process various patterns in a short time in processing an object to be processed using a laser beam as described above without the necessity of scanning the laser beam in the direction of processing and controlling the scanning speed or the like depending on a material to be processed as in the conventional YAG laser processing method.

Another object of the present invention is to make it possible to stably perform good processing on an object to be processed without causing abnormalities in the center or the periphery of a processed portion on which a laser beam is irradiated as in a case where an object to be processed is processed by a laser beam gathered.

Still another object of the present invention is to obtain a photovoltaic device having high photoelectric conversion efficiency in processing photoelectric converting elements in the photovoltaic device by a laser beam without causing abnormalities in the center or the periphery of a processed portion.

A further object of the present invention is to obtain a good crystallized semiconductor film having uniform properties in crystallizing an amorphous semiconductor film by a laser beam.

In a photoprocessing method according to the present invention, in processing an object to be processed by a laser beam, the laser beam is expanded by a beam expander and is introduced into a mask in which a light transmitted portion having a desired pattern is formed, the laser beam introduced into the mask is passed through the light transmitted portion having a desired pattern formed in the mask to obtain a laser beam corresponding to the pattern of the light transmitted portion as well as having an approximately uniform energy distribution, the laser beam is formed and projected on the object to be processed by an image forming lens, and processing corresponding to the pattern of the light transmitted portion is performed on the object to be processed by the laser beam formed and projected.

This eliminates the necessity of scanning a laser beam in a spot shape in the direction of processing to perform processing while suitably controlling the scanning speed or the like depending on a material to be processed as in the conventional YAG laser processing method, thereby to make it possible to simply perform processing corresponding to the pattern of the light transmitted portion on the object to be processed. In addition, there are no possibilities that spots of the laser beam are overlapped with each other, and the object to be processed is thermally affected to be degraded in a portion where the spots are overlapped with each other.

Furthermore, if the laser beam having an approximately uniform energy distribution which is passed through the light transmitted portion of the mask as described above is formed and projected on the object to be processed by the image forming lens, there is no possibility that the Gaussian distribution occurs in the energy intensity of the laser beam irradiated onto the object to be processed as in a case where the laser beam is gathered, whereby the laser beam having an approximately uniform energy distribution is irradiated onto the object to be processed. In addition, there is no possibility that abnormalities occur in the center or the periphery of a processed portion, thereby to make it possible to perform accurate processing corresponding to the pattern of the light transmitted portion on the object to be processed.

Furthermore, in the present invention, in processing photoelectric converting elements in a photovoltaic device by a laser beam, the laser beam is expanded by a beam expander and is introduced into a mask in which a light transmitted portion having a desired pattern is formed, the laser beam introduced into the mask is passed through the light transmitted portion having a desired pattern formed in the mask to obtain a laser beam corresponding to the pattern of the light transmitted portion as well as having an approximately uniform energy distribution, the laser beam is formed and projected on the photoelectric converting elements in the photovoltaic device to be processed by an image forming lens, and parts of the photoelectric converting elements in the photovoltaic device are removed by the laser beam formed and projected.

This makes it possible to simply perform various types of processing in the photoelectric converting elements in a short time, and eliminates the possibility that abnormalities occur in the center or the periphery of a processed portion, thereby to make it possible to simply obtain a good photovoltaic device in which little degradation or the like occurs in the processed portion.

Particularly in fabricating a photovoltaic device in which a plurality of photoelectric converting elements are electrically connected in series on the surface of an insulating substrate, if the mask is provided with a light transmitted portion in the shape of one or more straight lines, and groove processing is performed between one or more photoelectric converting elements adjacent to each other in correspondence with the pattern of the light transmitted portion as described above, the photovoltaic device is significantly simplified in fabrication and is high in quality.

Furthermore, in the present invention, in processing an amorphous semiconductor film by a laser beam, the laser beam is expanded by a beam expander and is introduced into a mask in which a light transmitted portion having a desired pattern is formed, the laser beam introduced into the mask is passed through the light transmitted portion having a desired pattern formed in the mask to obtain a laser beam corresponding to the pattern of the light transmitted portion as well as having an approximately uniform energy distribution, the laser beam is formed and projected on the amorphous semiconductor film to be processed by an image forming lens, and the amorphous semiconductor film is crystallized by the laser beam formed and projected.

This eliminates the possibility that the energy in the center of the laser beam and the energy in the periphery thereof differ from each other, whereby the crystallization of the amorphous semiconductor film is uniform, thereby to make it possible to obtain a good crystallized semiconductor film having uniform properties.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 13 to 18 are diagrams showing the steps of fabricating a photovoltaic device by the photoprocessing method according to the embodiment of the present invention, where

FIG. 15 is a schematic view showing a state where a photoelectric converting layer is provided on the entire surface of the substrate from above the divided first electrode film;

FIG. 16 is a schematic view showing a state where grooves are formed in portions of the photoelectric converting layer formed on the first electrode film, to divide the photoelectric converting layer;

FIG. 17 is a schematic view showing a state where a second electrode film is provided on the entire surface of the substrate from above the photoelectric converting layer divided as described above.

DESCRIPTION OF THE PREFERRED EMBODIMENTS

A photoprocessing method according to an embodiment of the present invention will be specifically described on the basis of FIGS. 6 to 12.

Figure 1:
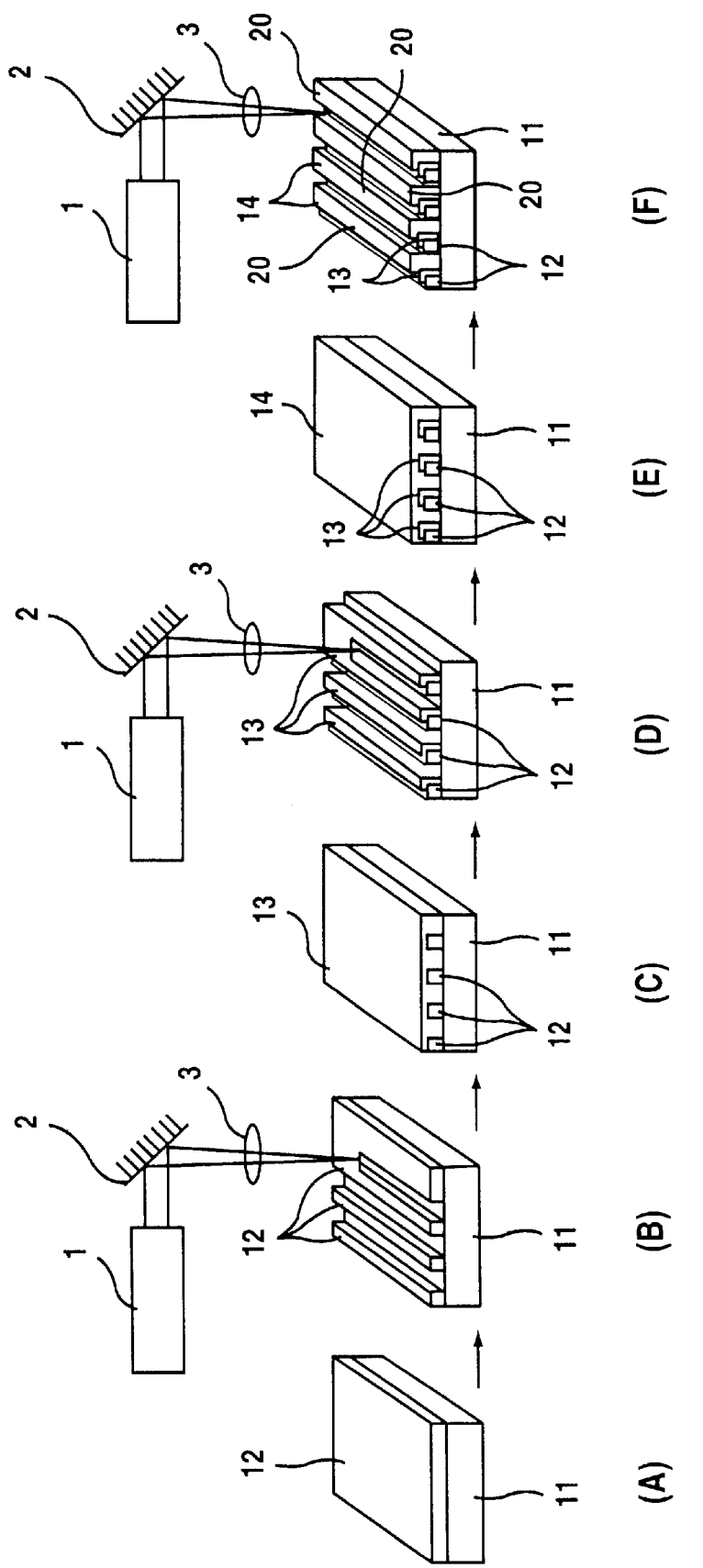
FIGS. 1(A) to 1(F) are diagrams showing the steps of fabricating a photovoltaic device in which a plurality of photoelectric converting elements are connected in series on the surface of an insulating substrate by a conventional YAG laser processing method.
Figure 2:
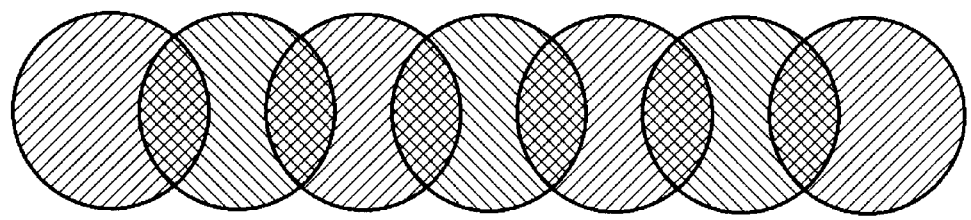
FIG. 2 is a diagram showing a state where spots of a laser beam are overlapped with each other by the conventional YAG laser processing method.
Figure 3:
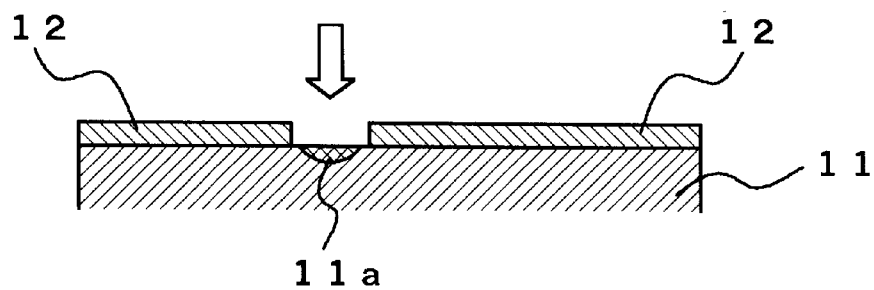
FIG. 3 is an illustration of a cross section in a conventional example showing a state where a first electrode film formed on a substrate is subjected to groove processing by a laser beam gathered.
Figure 4A:
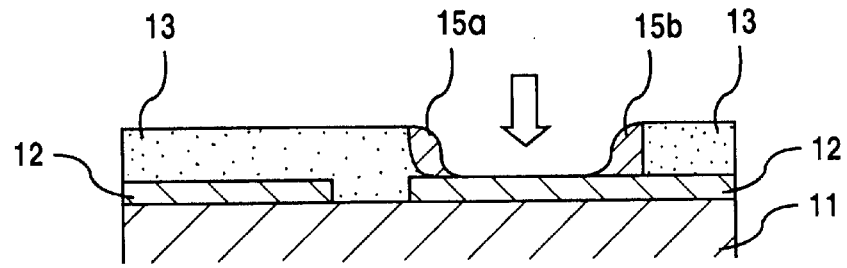
FIGS. 4(A) to 4(C) are illustrations of a cross section in the conventional example showing a state where a photoelectric converting layer formed on a first electrode film is subjected to groove processing by a laser beam gathered.
Figure 4B:
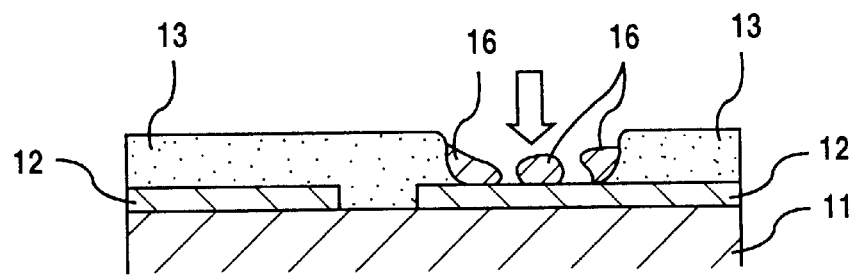
Figure 4C:
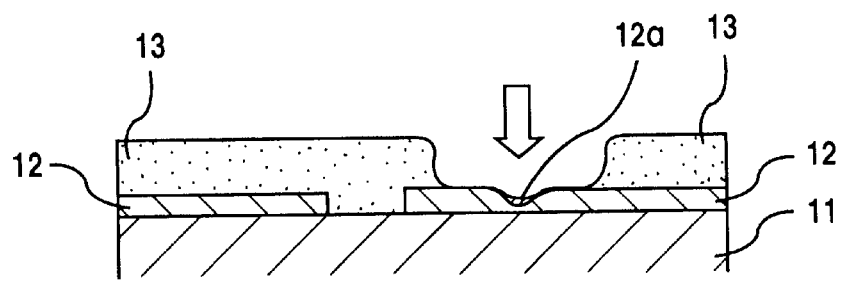
Figure 5A:
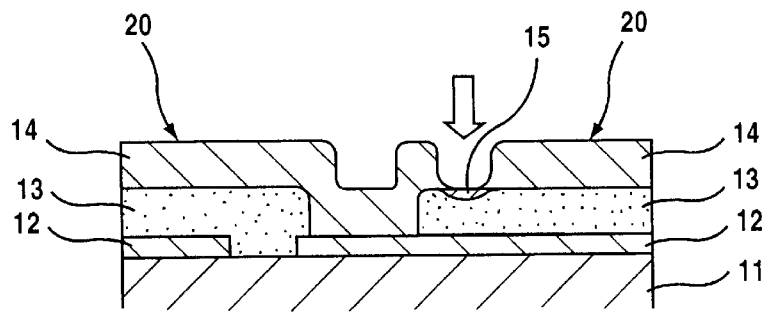
FIGS. 5(A) to 5(D) are illustrations of a cross section in the conventional example showing various states in a case where a second electrode film formed on the photoelectric converting layer is subjected to groove processing by the laser beam gathered.
Figure 5B:
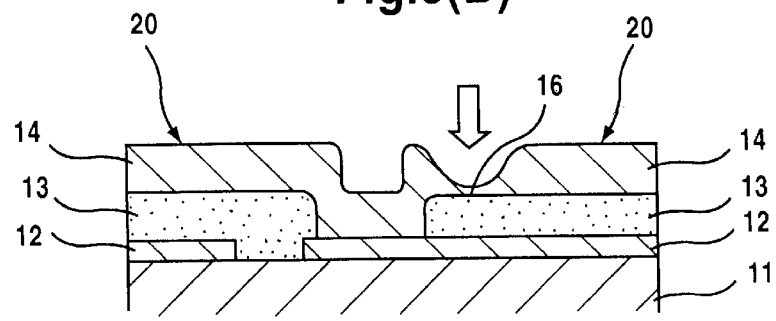
Figure 5C:
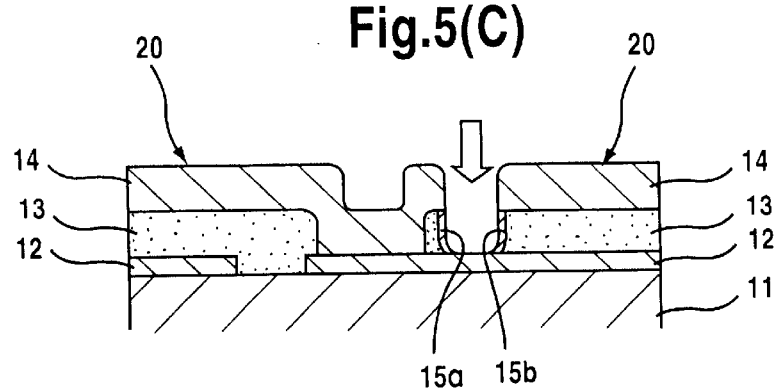
Figure 5D:
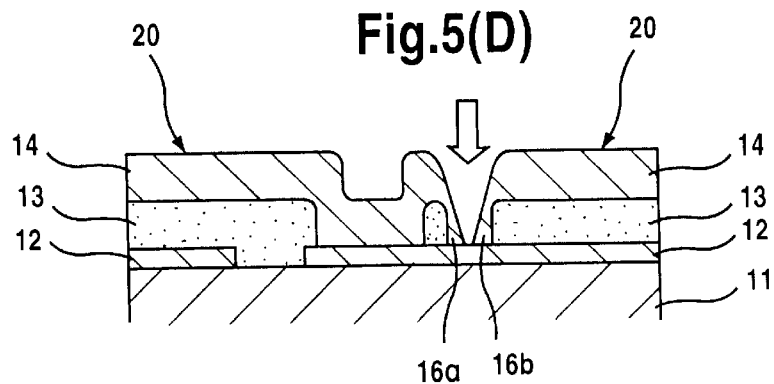
Figure 6:
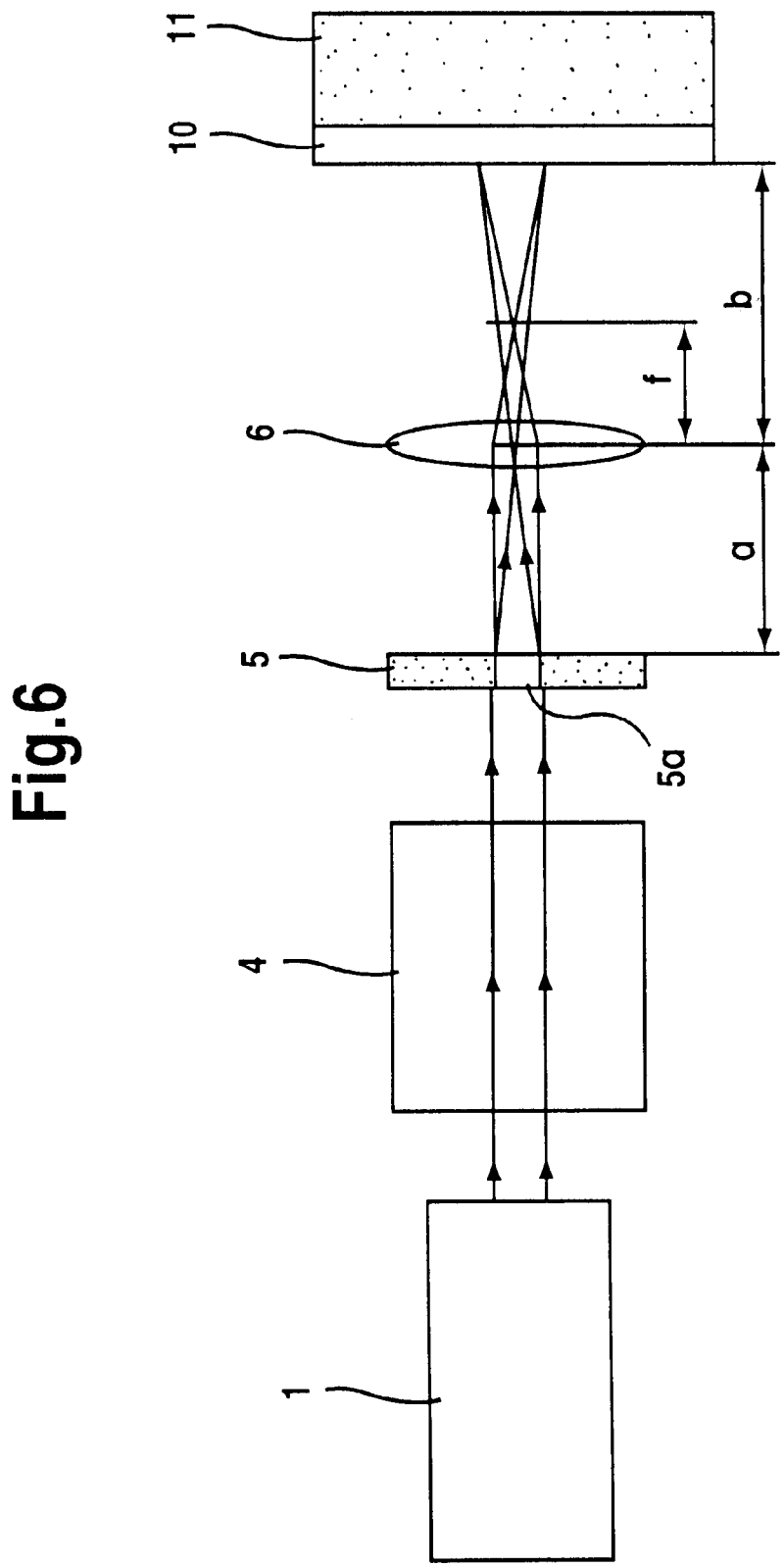
FIG. 6 is a schematic illustration showing a state where a laser beam is formed and projected on an object to be processed to perform processing in a photoprocessing method according to an embodiment of the present invention.
Figure 7:
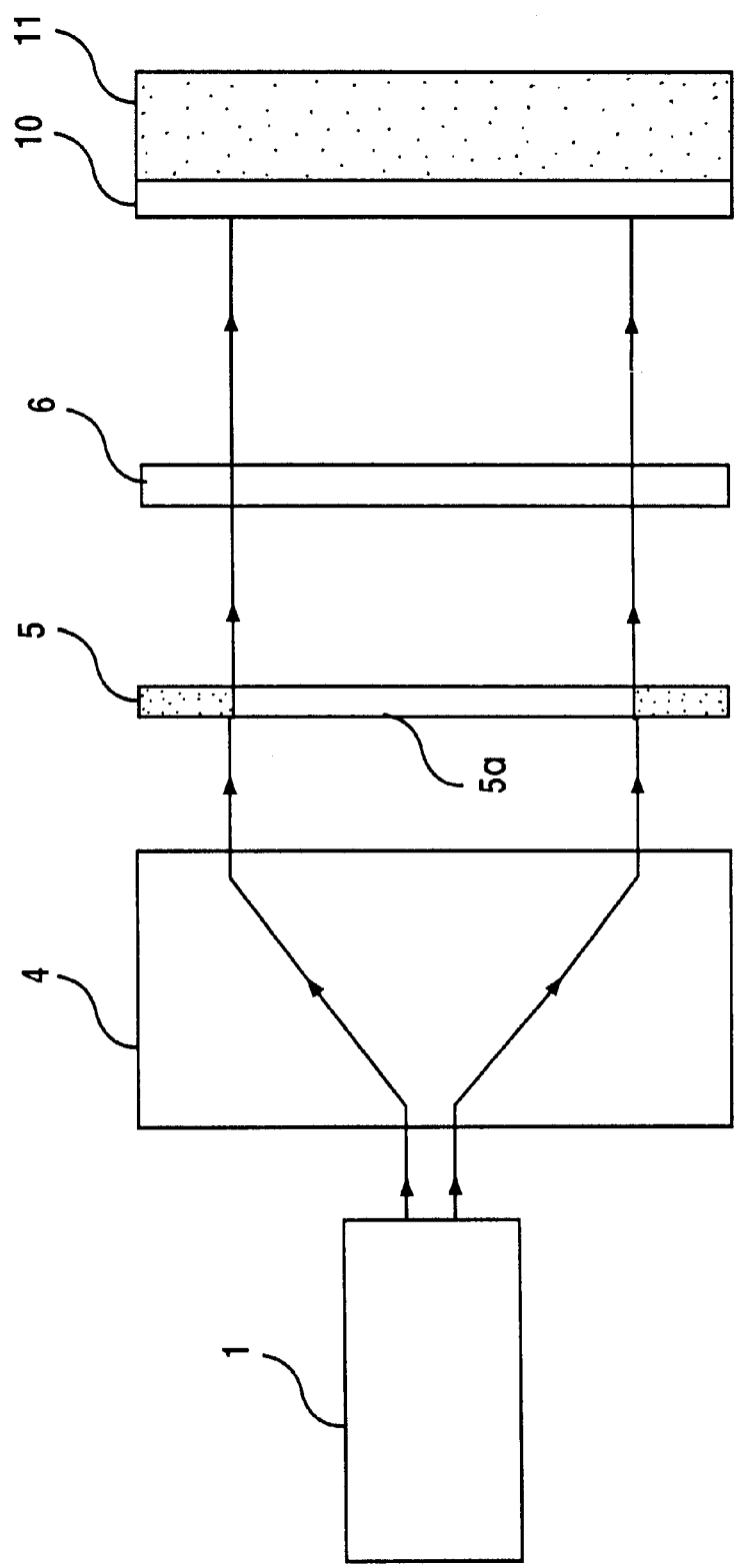
FIG. 7 is a schematic illustration showing a state where an object to be processed is processed by a laser beam as viewed from another direction in the photoprocessing method according to the present embodiment.
Figure 8:
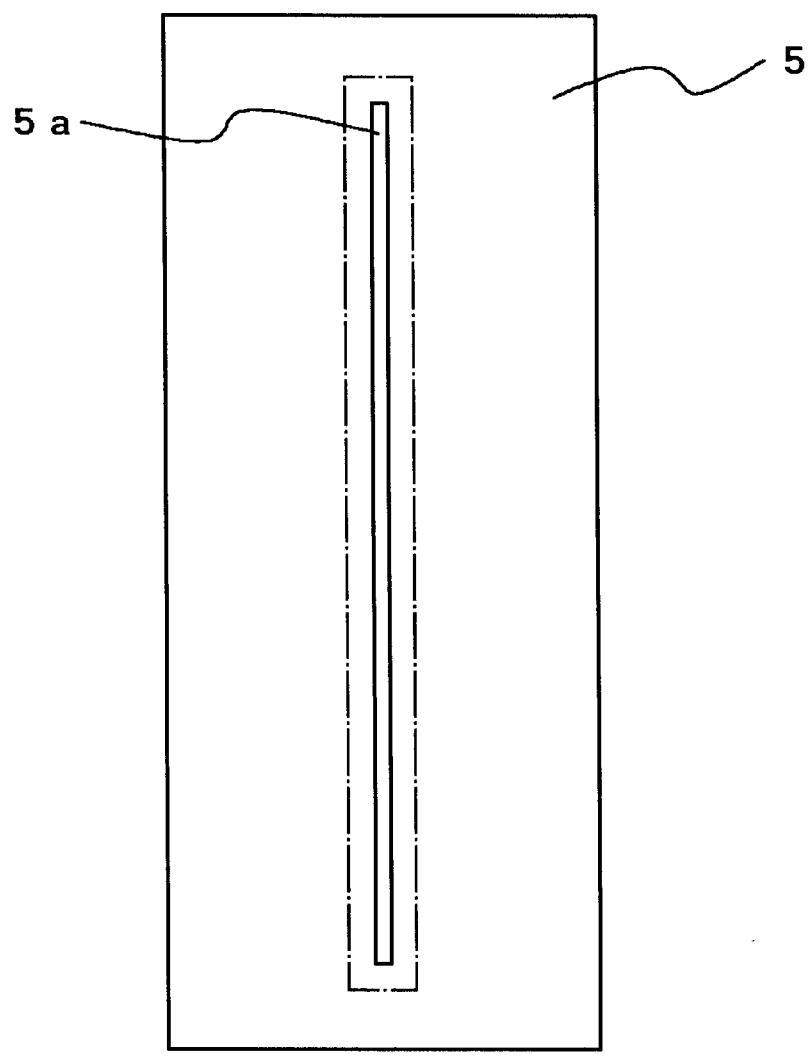
FIG. 8 is a plan view showing a mask used in the photoprocessing method according to the present embodiment.

In the photoprocessing method according to the present embodiment, a laser beam is first irradiated from a laser device 1, and the laser beam is expanded by a beam expander 4 to increase the area thereof, as shown in FIGS. 6 and 7.

As the above described laser beam, various types of laser beams such as gas laser and solid-state laser can be used. In the present embodiment, KrF eximer laser having a wavelength of 248 nm is used as the laser beam, and the laser beam having an area of 12 mm×20 mm is irradiated from the laser device 1. As the laser beam used, however, a laser beam having a suitable wavelength and energy is selectively used depending on the material of an object to be processed 10. Examples of the laser beam include second higher harmonic waves of ArF eximer laser having a wavelength of 193 nm, XeCl eximer laser having a wavelength of 308 nm, XeF eximer laser having a wavelength of 351 nm, copper vapor laser having a wavelength of 578 nm, Ar laser having a wavelength of 515 nm, and YAG laser having a wavelength of 530 nm. In order to subject the object to be processed 10 to uniform processing, it is preferable to use a laser beam having a predetermined energy distribution.

Furthermore, in expanding the laser beam by the beam expander 4 as described above, a beam expander 4 which is constituted by two-in-a-set cylindrical lenses is used, and a laser beam having an area of 12 mm×20 mm which is irradiated from the laser device 1 is longitudinally expanded as shown in FIG. 7 by the beam expander 4, to increase the area of the laser beam to 12 mm ×350 mm.

The laser beam expanded as described above is introduced into a mask 5, and is passed through a light transmitted portion 5a formed in the mask 5, to obtain a laser beam corresponding to the pattern of the light transmitted portion 5a as well as having an approximately uniform energy distribution.

When the laser beam is thus passed through the light transmitted portion 5a formed in the mask 5 to obtain the laser beam having an approximately uniform energy distribution, the energy distribution generally changes greatly in the periphery of the expanded laser beam. Generally, the periphery of the expanded laser beam is removed by the mask 5 in passing the laser beam through the light transmitted portion 5a formed in the mask 5, to introduce the center of the laser beam having an approximately uniform energy distribution into the light transmitted portion 5a and pass the laser beam through the light transmitted portion 5a.

In the present embodiment, the mask 5 is provided with the light transmitted portion 5a with a linear pattern having an area of 0.1 mm×300 mm the width and the length of which are made smaller than those of the expanded laser beam. The expanded laser beam in the periphery is reflected from the mask 5, while the laser beam in the center having an approximately uniform energy distribution is passed through the light transmitted portion 5a, thereby to obtain a laser beam corresponding to the pattern of the light transmitted portion 5a as well as having an approximately uniform energy distribution.

However, the pattern of the light transmitted portion 5a formed in the mask 5 is not particularly limited to such a linear pattern. The pattern may be a pattern in any shape. It is desirable to use, as the mask 5, a mask composed of a material from which a laser beam is reflected and which is hardly degraded by the laser beam, for example, a multi-layer or single-layer dielectric film, an optical mask composed of a metal thin film and a quartz glass substrate, or a metal mask.

The laser beam passed through the light transmitted portion 5a in the above described manner and having an approximately uniform energy distribution as well as corresponding to the pattern of the light transmitted portion 5a is introduced into an image forming lens 6. The laser beam is formed and projected on the object to be processed 10 formed on a substrate 11 by the image forming lens 6.

In thus forming the laser beam corresponding to the pattern of the light transmitted portion 5a on the object to be processed 10 by the image forming lens 6, the mask 5, the image forming lens 6, and the object to be processed 10 are so arranged that letting a be the distance between the mask 5 and the image forming lens 6, b be the di stanc e between the image forming lens 6 and the object to be processed 10, and f be the focal length of the image forming lens 6, a relationship of $1/a+1/b=1/f$ is satisfied in the present embodiment.

Furthermore, as th e above described image forming lens 6, a cylindrical lens longitudinally extending is used, to form the above described laser beam on the object to be processed 10 in the transverse direction, as shown in FIG. 6.

In thus forming the laser beam on the object to be processed 10 by the image forming lens 6, the laser beam having the pattern corresponding to the shape of the light transmitted portion 5a is formed on the object to be processed 10 at 1:1 magnification, and the laser beam of 0.1 mm in width by 300 mm in length having the same linear pattern as the shape of the light transmitted portion 5a is irradiated onto the object to be processed 10, to perform processing with the same linear pattern as the shape of the light transmitted portion 5a on the object to be processed 10 by the laser beam.

When the object to be processed 10 is thus processed, the laser beam in a spot shape need not be scanned in the direction of processing on the object to be processed 10 while adjusting the scanning speed or the like of the laser beam, as in the conventional YAG laser processing method, thereby to make it possible to simply perform processing corresponding to the pattern of the light transmitted portion 5a as well as to eliminate the possibility that the object to be processed 10 is thermally affected to be degraded in a portion where spots of the laser beam are overlapped with each other.

Furthermore, when the laser beam having an approximately uniform energy distribution which is passed through the light transmitted portion 5a in the mask 5 as described above is formed and projected on the object to be processed 10 by the image forming lens 6 and is irradiated onto the object to be processed 10, there is no possibility that the Gaussian distribution occurs in the energy intensity of the laser beam as in a case where the laser beam is gathered and is irradiated onto the object to be processed 10. Accordingly, the laser beam having an approximately uniform energy distribution which is approximately the same as that of the laser beam passed through the light transmitted portion 5a in the mask 5, whereby abnormalities do not occur in the center or the periphery of a processed portion.

Although in the present embodiment, a beam expander which is constituted by two-in-a-set cylindrical lenses is used as the beam expander 4 for expanding the laser beam, to expand the laser beam only longitudinally, a beam expander which is a combination of a spherical concave and convex lens and a cylindrical lens, for example, may be used, to expand the laser beam both longitudinally and laterally.

Figure 9:
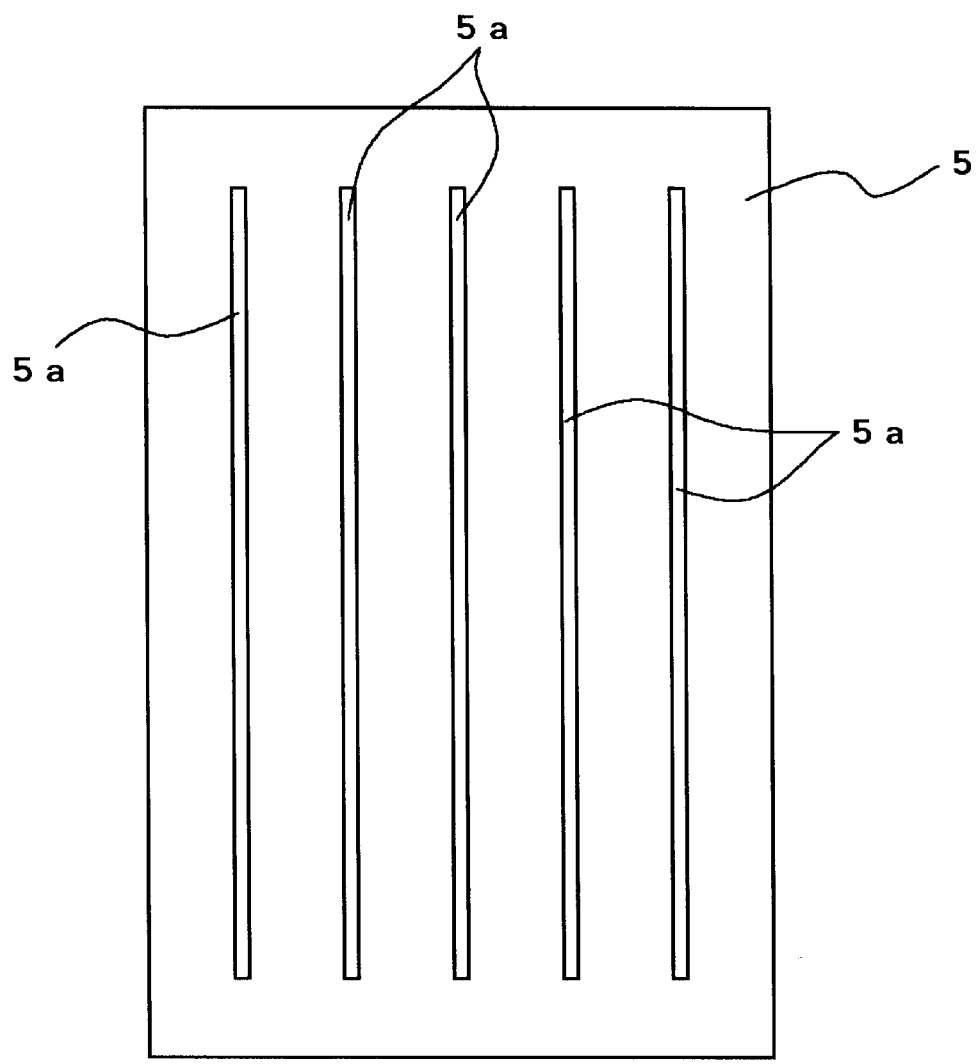
FIG. 9 is a plan view showing a modified example of the mask used in the photoprocessing method according to the present embodiment.
Figure 10:
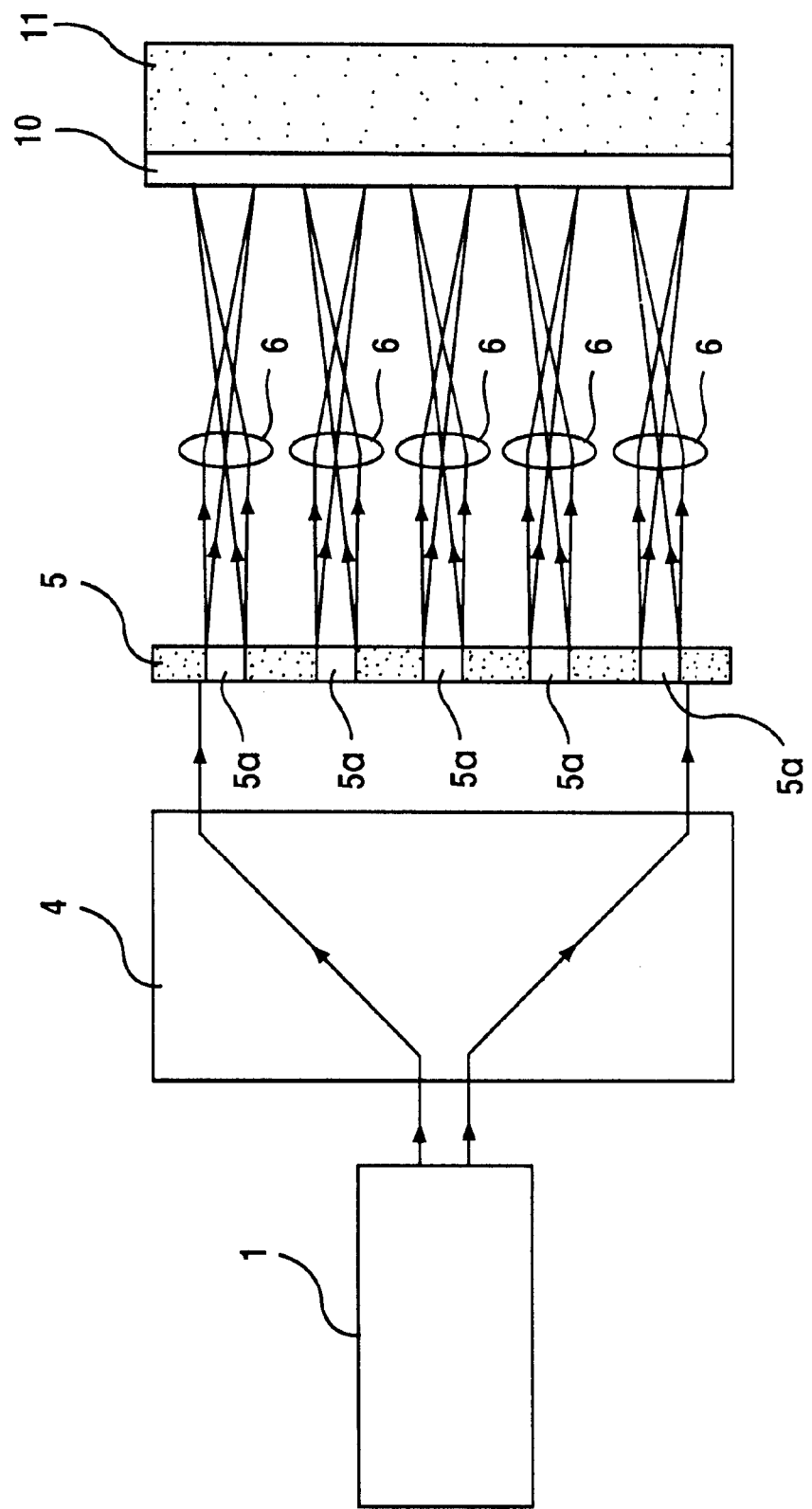
FIG. 10 is a schematic illustration showing a state where an object to be processed is processed using the mask shown in FIG. 9 in the photoprocessing method according to the present embodiment.
Figure 11:
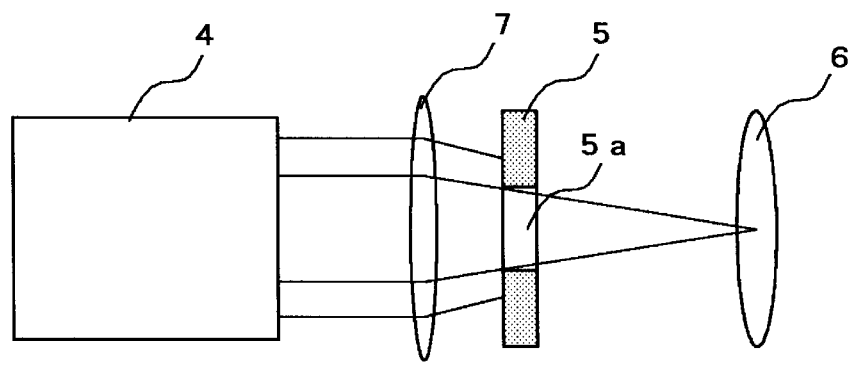
FIG. 11 is a schematic view showing a state where a field lens is provided short of a mask in the photoprocessing method according to the present embodiment.

Furthermore, when the laser beam is thus expanded longitudinally and laterally by the beam expander 4, the width of the laser beam introduced into the mask 5 is increased. Accordingly, a plurality of light transmitted portions 5a having a linear pattern can be also formed in the mask 5, as shown in FIG. 9, to form and project laser beams respectively passed through the light transmitted portions 5a on the object to be processed 10 by image forming lenses 6 as described above, as shown in FIG. 10, thereby to perform processing in the shape of a plurality of straight lines corresponding to the light transmitted portions 5a on the object to be processed 10 by the laser beams thus projected.

Although in the present embodiment, in forming the laser beam passed through the light transmitted portion 5a on the object to be processed 10, a cylindrical lens longitudinally extending is used as image forming lens 6, to form the laser beam on the object to be processed 10 only in the transverse direction, while introducing the laser beam into the object to be processed 10 as it is in the longitudinal direction, a method of forming the laser beam on the object to be processed 10 is not particularly limited to the foregoing method. For example, the laser beam may be formed on the object to be processed 10 in both the longitudinal and transverse directions using a spherical lens or the like as the above described image forming lens When the laser beam is formed on the object to be processed 10 by the image forming lens 6 as described above, it is preferable that a cylindrical image forming lens 6 made of synthetic quartz, a spherical lens, an achromat lens, or a lens in which aberration is removed by a combination of the lenses is used as the image forming lens 6 in order to accurately project the laser beam on the object to be processed 10 to perform processing with higher precision.

Furthermore, in order to further reduce the aberration in the image forming lens 6, it is preferable that a field lens 7 is provided short of the mask 5, the focus of the field lens 7 is positioned in the vicinity of the center of the image forming lens 6, and the laser beam is introduced into the center of the image forming lens 6 by the field lens 7, to further reduce the aberration in the image forming lens 6.

Additionally, although in the present embodiment, the laser beam passed through the light transmitted portion 5a in the mask 5 is formed on the object to be processed 10 at 1:1 magnification, magnification at which the laser beam is formed on the object to be processed 10 can be changed. Consequently, the length and the width of the laser beam formed on the object to be processed 10 can be also changed, to perform processing in different lengths and widths on the object to be processed 10 and to change the intensity of the laser beam irradiated onto the object to be processed 10 depending on the material or the like of the object to be processed 10.

If a laser beam having high energy is required to process the object to be processed 10, the width of the light transmitted portion 5a formed in the mask 5 is increased. For example, in providing the mask 5 with the light transmitted portion 5a having a linear pattern of 1 mm×300 mm and forming the laser beam passed through the light transmitted portion 5a on the object to be processed 10 by the image forming lens 6, magnification at which the laser beam is formed in the transverse direction is set to 1/10 to form and project the laser beam having a linear pattern of 0.1 mm×300 mm on the object to be processed 10 and perform groove processing of 0.1 mm×300 mm on the object to be processed 10 by the laser beam.

Furthermore, in processing the object to be processed 10 as described above, if the allowed energy of the laser beam is within a particular narrow range, magnification at which the laser beam is expanded by the beam expander 4, the dimensions of the light transmitted portion 5a in the mask 5 through which the laser beam is passed, magnification at which the laser beam is formed on the object to be processed 10 by the image forming lens 6, and the like are controlled, 27 to accurately adjust the energy of the laser beam irradiated onto the object to be processed 10 as well as to reduce the variation in the energy distribution in the laser beam, to reduce the width of the variation in the energy of the laser beam irradia ted onto the object to be processed 10.

Figure 12:
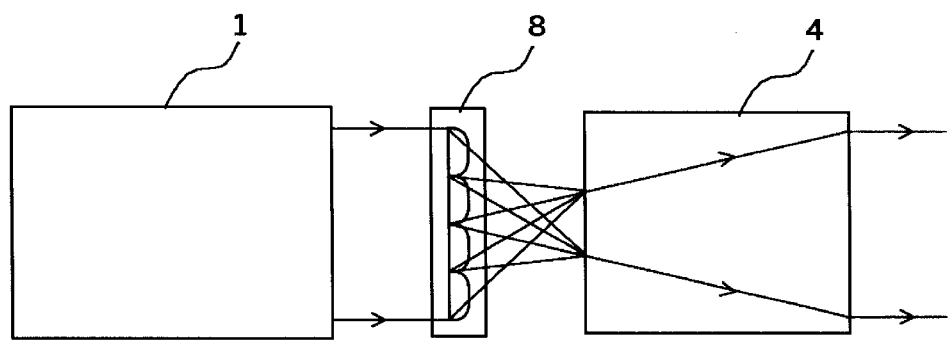
FIG. 12 is a schematic view showing a state where the energy distribution of a laser beam irradiated from a laser device is homogenized by a beam homogenizer in the photoprocessing method according to the present embodiment.

If the variation in the energy distribution in the laser beam is large, and the energy of the laser beam irradiated onto the object to be processed 10 varies beyond the allowed range, however, it is preferable that a beam homogenizer 8 of a prism type, a fly-eye lens type or the like is provided short of the beam expander 4 into which the laser beam irradiated from the laser device 1 is introduced, as shown in FIG. 12, to further homogenize the energy distribution of th e laser beam introduced into the mask 5 through the beam homogenizer 8.

An embodiment in which photoelectric converting elements in a photovoltaic device are then subjected to groove processing using the above described photoprocessing method, to fabricate the photovoltaic device in which a plurality of photoelectric converting elements are electrically connected in series on the surface of an insulating substrate will be specifically described on the basis of FIGS. 13 to 18.

Figure 13A:
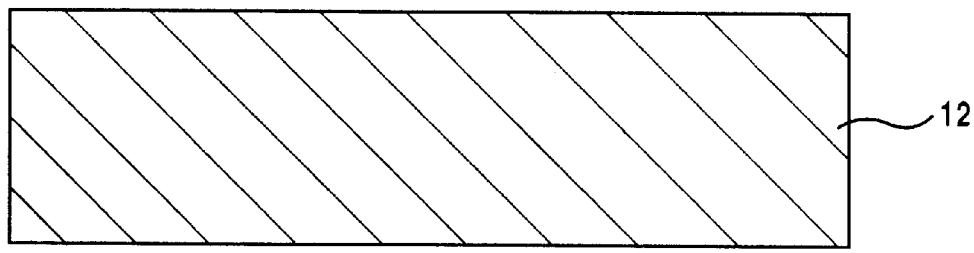
FIGS. 13(A) to 13(B) are schematic diagrams showing a state where a first electrode film is formed on the surface of a substrate.
Figure 13B:
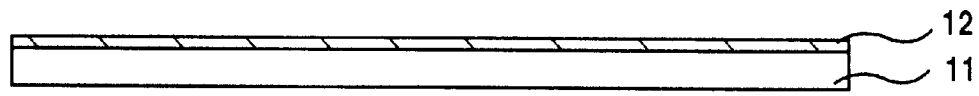

As shown in FIGS. 13(A) and 13(B), a high-reflective first electrode film 12 is formed on the entire surface of a substrate 11.

As the above described substrate 11, a substrate constructed by coating a glass plate having a thickness of 1mm to 3 mm and having an area of approximately 10 cm×10 cm to 0.3 m×1 m or an SUS plate having a thickness of 0.1 mm to 1 mm and having an area of approximately 10 cm×10 cm to 0.3 m×1 m with an insulating organic film having a thickness of 0.1 mm to 0.7 mm is used in the present embodiment. In addition, as the high-reflective first electrode film 12 formed on the surface of the substrate 11, an aluminum single-layer electrode film having a thickness of approximately 2000 Å to 8000 Å, an electrode film obtained by laminating titanium or titanium silver on aluminum, a silver single-layer electrode film, an electrode film obtained by laminating ITO on silver, and the like are used.

Figure 14A:
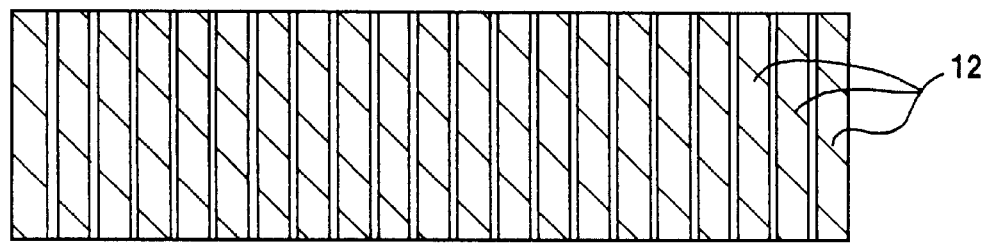
FIGS. 14(A) and 14(B) are schematic diagrams showing a state where grooves are formed in the first electrode film formed on the surface of the substrate, to divide the first electrode film.
Figure 14B:
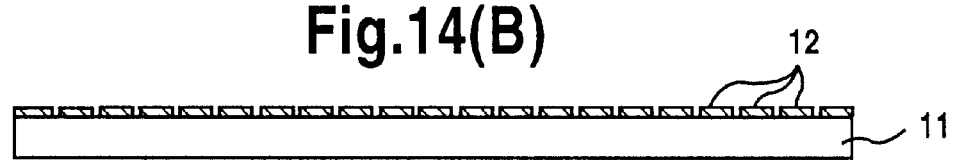

The laser beam obtained through the light transmitted portion 5a in the mask 5 is formed and projected by the image forming lens 6 on the first electrode film 12 formed on the surface of the substrate 11 in a manner as shown in the above described photoprocessing method, and the first electrode film 12 is subjected to groove processing corresponding to the linear pattern of the light transmitted portion 5a by the laser beam, to divide the first electrode film 12 between the adjacent photoelectric converting elements 20, as shown in FIGS. 14(A) and 14(B). In thus subjecting the first electrode film 12 to groove processing, the energy density of the laser beam irradiated onto the first electrode film 12 is set to approximately 0.1 to 1 J/cm$^2$ in the present embodiment.

Figure 15:
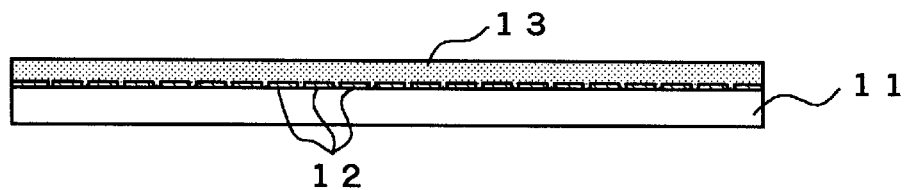

After the first electrode film 12 thus formed on the surface of the substrate 11 is divided between the adjacent photoelectric converting elements 20, a photoelectric converting layer 13 is formed on the entire surface of the substrate 11, as shown in FIG. 15, from above the first electrode film 12 thus divided.

In forming the photoelectric converting layer 13 on the entire surface of the substrate 11, n-type amorphous silicon, i-type amorphous silicon, p-type amorphous silicon carbide are successively laminated, to form an nip-type amorphous semiconductor film having a thickness of 2000 Å to 7000 Å in the present embodiment. However, the photoelectric converting layer 13 to be formed is not particularly limited to the same. Examples of the photoelectric converting layer 13 may include one composed of a crystal system semiconductor film or the like, or one obtained by laminating several types of amorphous semiconductor films which differ in the band gap, for example, amorphous silicon and amorphous silicon germanium, to provide an amorphous semiconductor film having a multiband gap structure in which a plurality of nip junctions are formed.

Figure 16:
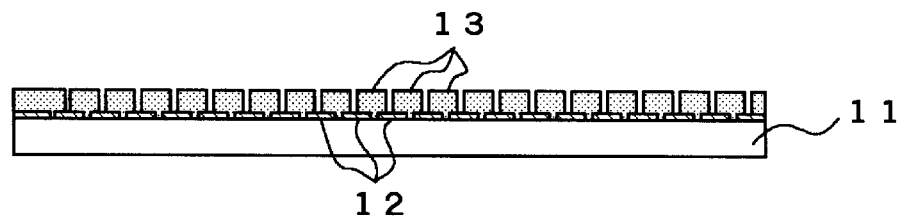

The laser beam obtained through the light transmitted portion 5a in the mask 5 is formed and projected by the image forming lens 6 on the photoelectric converting layer 13 thus formed as shown in the above described photoprocessing method, and the photoelectric converting layer 13 in portions formed on the first electrode film 12 is subjected to groove processing corresponding to the linear pattern of the light transmitted portion 5a by the laser beam, as shown in FIG. 16, to divide the photoelectric converting layer 13 between the adjacent photoelectric converting elements 10. In thus subjecting the photoelectric converting layer 13 to groove processing, the energy density of the laser beam to be irradiated onto the photoelectric converting layer 13 is set to approximately 0.3 to 0.9 J/cm$^2$, to irradiate the above described laser beam once to several times as required in the present invention.

Figure 17:
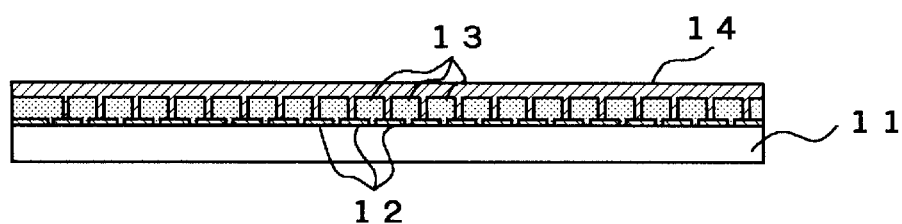

After the photoelectric converting layer 13 formed on the first electrode film 12 is thus divided between the photoelectric converting elements 20, a transparent second electrode film 14 is formed on the entire surface of the substrate 11 from above the photoelectric converting layer 13, as shown in FIG. 17.

As the above described second electrode film 14, ITO (indium oxide to which 5% by weight of tin oxide is added) having a thickness of 500 Å to 1000 Å, SnO$_2$, ZnO or the like is provided.

Figure 18A:
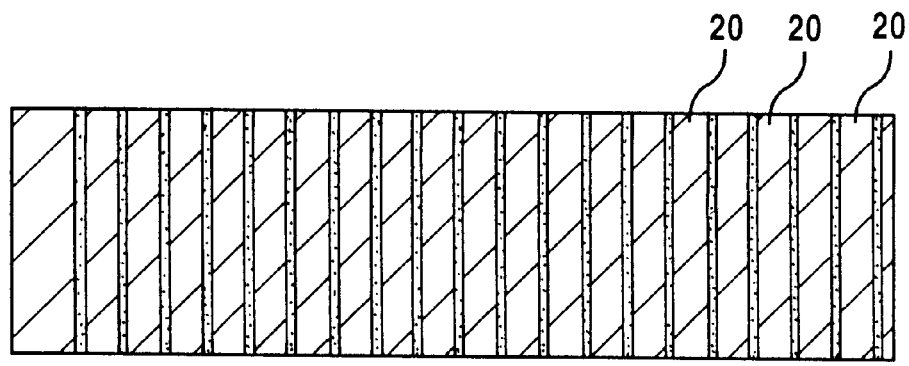
FIGS. 18(A) and 18(B) are schematic views showing a state where grooves are formed in portions of the second electrode film on the photoelectric converting layer and the second electrode film is divided, to fabricate a photovoltaic device.
Figure 18B:
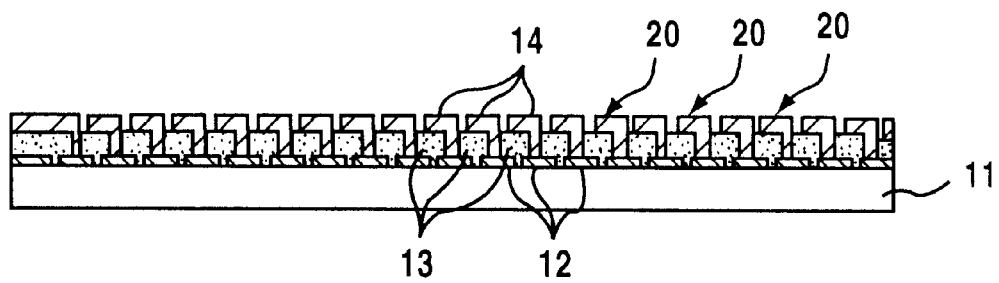

The laser beam obtained through the light transmitting portion 5a in the mask 5 is formed and projected by the image forming lens 6 on the transparent second electrode film 14 thus formed as shown in the above described photoprocessing method. The second electrode film 14 is subjected to groove processing in portions formed on the photoelectric converting layer 13, as shown in FIG. 18, by the laser beam, to divide the second electrode film 14 between the adjacent photoelectric converting elements 20, thereby to obtain a photovoltaic device in which a plurality of photoelectric converting elements 20 are electrically connected in series by the second electrode film 14 and the first electrode film 12 on the substrate 11. In thus subjecting the second electrode film 14 to groove processing, the energy density of the laser beam to be irradiated onto the second electrode film 14 is set to approximately 0.1 to 1 J/cm$^2$.

When the potovoltaic device is thus fabricated, the necessity of performing groove processing by scanning the laser beam in a spot shape in the direction of processing while controlling the scanning speed or the like depending on a material to be processed as in the conventional YAG processing method is eliminated. Consequently, the fabrication of the photovoltaic device becomes simple, and time required to fabricate the photovoltaic device is significantly reduced, thereby to significantly improve the productivity as well as to eliminate the possibility that spots of the laser beam are overlapped with each other to degrade a processed portion.

Since the laser beam obtained through the light transmitted portion 5a in the mask 5 as described above is formed and projected by the image forming lens 6 and is irradiated, there are no possibilities that the Gaussian distribution occurs in the energy intensity as in the laser beam gathered, and various abnormalities occur in the center or the periphery of a groove processed portion when groove processing is performed between the adjacent photoelectric converting elements 20, thereby to obtain a good photovoltaic device which is hardly degraded, for example, in the processed portion.

Although in the present embodiment, the photovoltaic device on which light is incident from above the transparent second electrode film 14 is fabricated, the type of photovoltaic device fabricated by the photoprocessing method according to the present invention is not particularly limited to the same.

For example, it is also possible to fabricate a photovoltaic device so adapted that a substrate made of a transparent material such as glass is used, a transparent electrode film which is used as the second electrode film in the above described embodiment is provided as a first electrode film on the transparent substrate, the first electrode film is subjected to groove processing in the same manner as in the above described embodiment, a photoelectric converting layer composed of a pin-type amorphous semiconductor film, for example, constructed by successively laminating p-type amorphous silicon carbide, i-type amorphous silicon, and n-type amorphous silicon is formed on the first electrode film, the photoelectric converting layer is also subjected to groove processing in the same manner as in the above described embodiment, a high-reflective electrode film which is used as the first electrode film in the above described embodiment is provided as a second electrode film on the photoelectric converting layer, the second electrode film is also subjected to groove processing in the same manner as in the above described embodiment, and light is incident from above the transparent substrate.

Figure 19A:
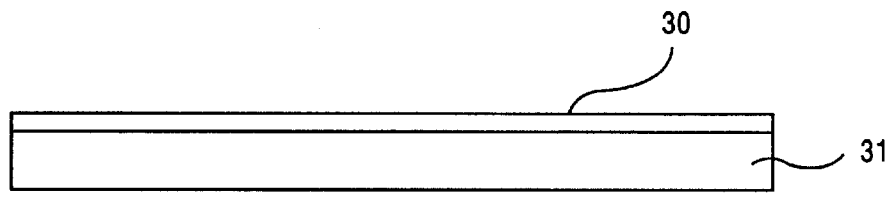
FIGS. 19(A), 19(B) and 19(C) are illustrations showing the steps of crystallizing an amorphous semiconductor film formed on a substrate by the photoprocessing method according to the embodiment of the present invention.
Figure 19B:
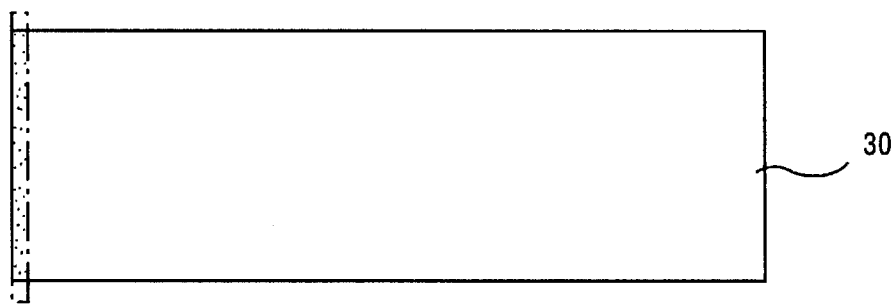
Figure 19C:
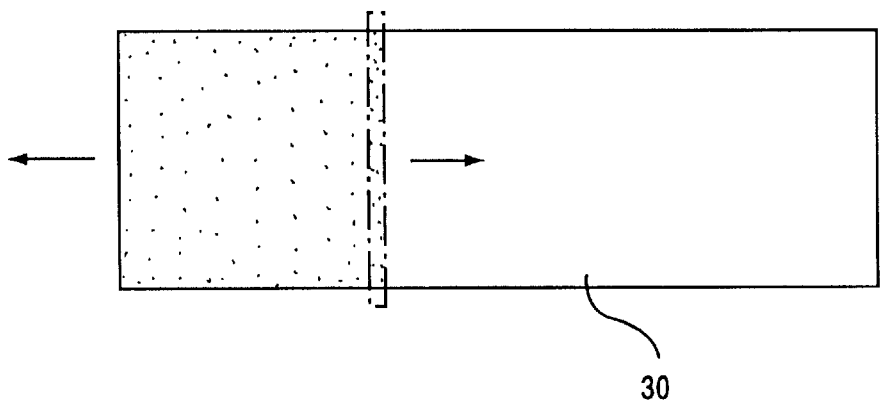

An embodiment in which an amorphous semiconductor film formed on a substrate is crystallized using the above described photoprocessing method will be specifically described on the basis of FIGS. 19(A) to 19(C).

In the present embodiment, a glass substrate 31 having a large area of 40 cm×100 cm, for example, is used as a substrate 31 on which the amorphous semiconductor film is provided. As shown in FIG. 19(A), an amorphous silicon film 30 having a thickness of 500 Å is formed as the amorphous semiconductor film 30 on the glass substrate 31. The material, the dimensions and the like of the substrate 31 used can be freely changed. In addition, the material and the thickness of the amorphous semiconductor film 30 can be also freely changed. An amorphous semiconductor film 30 having a thickness of 300 to 1000 Å is generally provided.

In then crystallizing the amorphous silicon film 30 formed on the glass substrate 31, the substrate temperature is set in the range of room temperature to 400° C., a laser beam obtained through a transmitting portion 5a in a mask 5 is formed and projected on the amorphous silicon film 30 as shown in the above described photoprocessing method, and a laser beam in a linear shape of 45 cm in length by 1 cm in width is irradiated, as shown in FIG. 19(B), to crystallize the amorphous silicon film 30 in a portion on which the laser beam is irradiated. As the laser beam, a laser beam having an energy density in the range of 200 to 500 mJ/cm$^2$ is used.

As shown in FIG. 19(C), the laser beam is irradiated onto the entire amorphous silicon film 30 formed on the glass substrate 31 by scanning either one or both of the laser beam obtained through the light transmitting portion 5a in the mask 5 and the glass substrate 31 on which the amorphous silicon film 30 is formed, to cry stallize the entire amorphous silicon film 30.

If the entire amorphous silicon film 30 is thus crystallized, the entire amorphous silicon film 30 can be crystallized more simply and in a shorter time, as compared with a case where the laser beam in a spot shape is scanned while controlling the scanning speed or the like depending on a material to be processed as in the conventional YAG laser processing method. Further, there is no possibility that the crystallization is non-uniform in a portion where spots of the laser beam are overlapped with each other and the other portion.

Furthermore, the entire surface of the amorphous silicon film 30 is crystallized by the laser beam homogenized through the light transmitted portion 5a in the mask 5 as described above, thereby to obtain a good crystallized semiconductor film having uniform properties.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A photoprocessing method for processing an amorphous semiconductor film by a laser beam, comprising the steps of:

passing the laser emitted from a laser device through a beam homogenizer to homogenize an energy distribution of the laser beam;

expanding the laser beam by a beam expander;

introducing the expanded laser beam into a mask in which a light transmitted portion having a desired pattern is formed;

passing the expanded laser beam through the light transmitted portion so that a peripheral portion of the expanded laser beam having non-uniform energy intensity distribution is removed to obtain a patterned laser beam having an approximately uniform energy intensity distribution;

forming an image having approximately the same pattern as that of the light transmitted portion by projecting the patterned laser beam on the amorphous semiconductor film to be processed by an image forming lens so that the image is formed on an approximately whole area of the amorphous semiconductor film to be processed; and crystallizing the amorphous semiconductor film in a shape corresponding to the pattern of the light transmitted portion by the patterned laser beam projected thereon without scanning the laser beam, wherein a field lens is provided just short of the mask into which the laser beam is introduced, and the expanded laser beam is introduced into the field lens.

2. A photoprocessing method for processing photoelectric converting elements in a photovoltaic device by a laser beam, comprising the steps of:

passing the laser beam emitted from a laser device through a beam homogenizer to homogenize an energy distribution of the laser beam;

expanding the laser beam by a beam expander;

introducing the expanded laser beam through a field lens into a mask in which a light transmitted portion having a desired pattern is formed;

passing the expanded laser beam through the light transmitted portion so that a peripheral portion of the expanded laser beam having non-uniform energy intensity distribution is removed to obtain a patterned laser beam having an approximately uniform energy intensity distribution;

forming an image having approximately the same pattern as that of the light transmitted portion by projecting the patterned laser beam on the photoelectric converting elements by an image forming lens so that the image is formed on an approximately whole area of all the photoelectric converting elements to be processed; and processing the photoelectric converting element by the patterned laser beam projected thereon without scanning the laser beam, wherein the field lens is provided short of the mask and the focus of the field lens is positioned in the vicinity of the center of the image forming lens.

3. A photoprocessing method for processing photoelectric converting elements in a photovoltaic device by a laser beam, comprising the steps of:

passing the laser emitted from a laser device through a beam homogenizer to homogenize an energy distribution of the laser beam;

expanding the laser beam by a beam expander;

introducing the expanded laser beam through a field lens into a mask in which a light transmitted portion having a desired pattern is formed;

introducing the expanded laser beam through a field lens into a mask in which a light transmitted portion having a desired pattern is formed;

passing the expanded laser beam through the light transmitted portion so that a peripheral portion of the expanded laser beam having non-uniform energy intensity distribution is removed to obtain a patterned laser beam having an approximately uniform energy intensity distribution;

forming an image having approximately the same pattern as that of the light transmitted portion by projecting the patterned laser beam on the photoelectric converting elements by an image forming lens so that the image is formed on an approximately whole area of all the photoelectric converting elements to be processed; and removing the photoelectric converting elements in the photovoltaic device in a shape corresponding to the pattern of the light transmitted portion by the laser beam projected thereon without scanning the laser beam, wherein the field lens is provided short of the mask and the focus of the field lens is positioned in the vicinity of the center of the image forming lens.

4. A photoprocessing method for processing an amorphous semiconductor film by a laser beam, comprising the steps of:

passing the laser emitted from a laser device through a beam homogenizer to homogenize an energy distribution of the laser beam;

expanding the laser beam by a beam expander;

introducing the expanded laser beam through a field lens into a mask in which a light transmitted portion having a desired pattern is formed;

passing the expanded laser beam through the light transmitted portion so that a peripheral portion of the expanded laser beam having non-uniform energy intensity distribution is removed to obtain a patterned laser beam having an approximately uniform energy intensity distribution;

forming an image having approximately the same pattern as that of the light transmitted portion by projecting the patterned laser beam on the amorphous semiconductor film to be processed by an image forming lens so that the image is formed on an approximately whole area of the amorphous semiconductor film to be processed; and crystallizing the amorphous semiconductor film in a shape corresponding to the pattern of the light transmitted portion by the patterned laser beam projected thereon without scanning the laser beam, wherein the field lens is provided short of the mask and the focus of the field lens is positioned in the vicinity of the center of the image forming lens.

5. The photoprocessing method according to any of claims 1 or 2–4, wherein letting a be the distance between said mask and the image forming lens, b be the distance between the image forming lens and the object to be processed, and f be the focal length of the image forming lens, the mask, the image forming lens, and the object to be processed are so arranged as to satisfy a relationship of $1/a+1/b=1/f$.

6. The photoprocessing method according to any of claims 1 or 2–4, wherein a light transmitted portion in the shape of one or more straight lines is provided in the mask into which the laser beam is introduced, the laser beam passed through the light transmitted portion is formed and projected on the object to be processed by the image forming lens, and processing in the shape of one or more straight lines corresponding to the pattern of said light transmitted portion is performed on the object to be processed by the laser beam imaged and projected.

* * * * *